United States Patent [19]

Aslam et al.

[11] Patent Number: 5,488,350

[45] Date of Patent: Jan. 30, 1996

[54] DIAMOND FILM STRUCTURES AND METHODS RELATED TO SAME

[75] Inventors: Mohammad Aslam; James V. Beck, both of Okemos, Mich.

[73] Assignee: Michigan State University, East Lansing, Mich.

[21] Appl. No.: 178,784

[22] Filed: Jan. 7, 1994

[51] Int. Cl.$^6$ ............................................. H01L 21/265
[52] U.S. Cl. ..................... 338/225 D; 219/482; 219/541; 219/553
[58] Field of Search .................. 338/225 D; 219/553, 219/482, 541

[56] References Cited

U.S. PATENT DOCUMENTS

| | | | |
|---|---|---|---|
| 3,433,684 | 3/1969 | Zanowick et al. | 148/33.4 |
| 4,806,900 | 2/1989 | Fujimori et al. | 338/225 D |
| 4,808,009 | 2/1989 | Sittler et al. | 374/178 |
| 4,826,784 | 5/1989 | Salerno et al. | 148/DIG. 26 |
| 4,863,529 | 9/1989 | Imai et al. | 148/33.4 |
| 4,919,974 | 4/1990 | McCune et al. | 427/249 |
| 4,925,701 | 5/1990 | Jansen et al. | 427/38 |
| 5,006,203 | 4/1991 | Purdes | 156/646 |
| 5,066,938 | 11/1991 | Kobashi et al. | 338/225 D |
| 5,075,094 | 12/1991 | Morrish et al. | 423/446 |
| 5,082,359 | 1/1992 | Kirkpatrick | 359/642 |
| 5,082,522 | 1/1992 | Purdes et al. | 156/612 |
| 5,089,802 | 2/1992 | Yamazaki | 338/225 D |
| 5,107,317 | 4/1992 | Takasaki | 357/30 |
| 5,110,577 | 5/1992 | Tamor et al. | 423/445 |
| 5,114,696 | 5/1992 | Purdes | 156/446 |
| 5,131,963 | 7/1992 | Ravi | 148/33.3 |
| 5,144,380 | 9/1992 | Kimoto et al. | 357/22 |
| 5,173,761 | 12/1992 | Dreifus et al. | 257/22 |
| 5,183,530 | 2/1993 | Yamazaki | 156/643 |
| 5,186,973 | 2/1993 | Garg et al. | 427/590 |
| 5,190,823 | 3/1993 | Anthony et al. | 428/408 |
| 5,204,210 | 4/1993 | Jansen et al. | 430/195 |
| 5,260,141 | 11/1993 | Tsai et al. | 428/634 |
| 5,271,971 | 12/1993 | Herb et al. | 427/577 |
| 5,290,592 | 3/1994 | Izuchi et al. | 427/203 |
| 5,298,286 | 3/1994 | Yang et al. | 427/249 |
| 5,308,661 | 5/1994 | Feng et al. | 427/535 |
| 5,309,000 | 5/1994 | Saito et al. | 257/76 |
| 5,317,302 | 5/1994 | Yamazaki | 338/225 D |

OTHER PUBLICATIONS

Exhibit A is an article by A. Masood and M. Aslam and others entitled "Synthesis and electrical characterization of boron–doped thin diamond films", dated Oct. 12, 1992, published in Appl. Phys. Letter, vol. 61 (15), pp. 1832–1834 and published by the American Institute of Physics.

Exhibit B is an article by M. Aslam and A. Masood and others entitled "Thin Film Diamond Temperature Sensor Array for Harsh Aerospace Environment", dated Apr. 20, 1992, published at a Conference of SPIE in Orlando, Florida, SPIE Code No. 1694–20.

Exhibit C is an article by A. Masood and M. Aslam and others entitled "Techniques for Patterning of CVD Diamond Films on Non–Diamond Substrates", dated Nov. 1991, published in The Electrochemical Society, Inc., vol. 138, No. 11. The article discloses mixing diamond particles with photoresist and pattering the applied mixture, after which chemical vapor deposition (CVD) is used to grow a diamond film.

(List continued on next page.)

*Primary Examiner*—Archene Turner
*Attorney, Agent, or Firm*—Price, Heneveld, Cooper, DeWitt & Litton

[57] ABSTRACT

Novel structures are provided including laminated layers of the diamond film in different patterns for conducting, generating and/or absorbing thermal energy. In particular, a thermal sensor/heater is shown including a doped electrically conductive diamond film layer encapsulated by layers of undoped electrically insulative layers on a silicon wafer. Also, a GaAs/Si on diamond laminate structure is provided in which the diamond film acts as a substrate and a heat sink. Notably, the diamond film structures are characterized by their high thermal conductivity, high chemical resistance, and high hardness/wear resistance due to the properties of the diamond films.

11 Claims, 2 Drawing Sheets

OTHER PUBLICATIONS

Exhibit D is an article by R. Erz et al. entitled "Preparation of smooth and Nanocystalline Diamond Films", dated 1993, copyrighted by Elsevier Sequoia, authors R. Erz et al. being associated with a German University.

Item E is a prior art mixture including diamond particles mixed with photoresist. The mixture was applied by spin coating to a planar substrate surface, as disclosed in the background of the specification of this application.

Exhibit F is a trade publication entitled *Diamond Depositions*, published by Superconductivity Publications, Inc., dated Nov. 22, 1991, vol. 2, No. 8, including pp. 1–24, that includes an article entitled "Aslam of Michigan State & Tamor of Ford Discover New Application for Diamond" on pp. 1 and 5–7 which describes potential applications and properties of piezoresistive devices including diamond films.

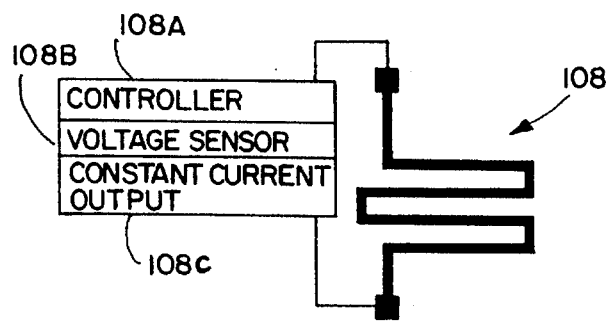
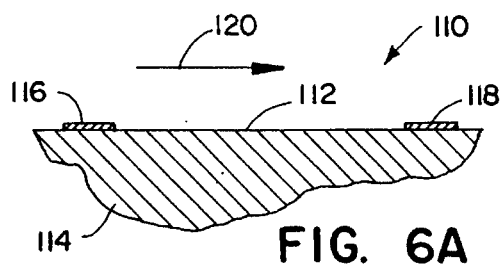
FIG. 7
FIG. 6A
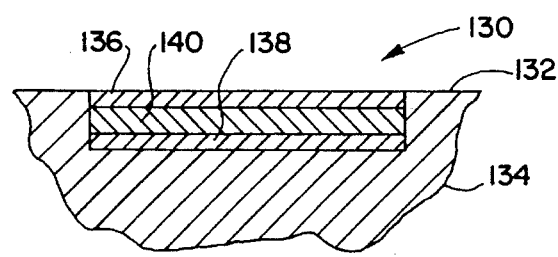
FIG. 6B
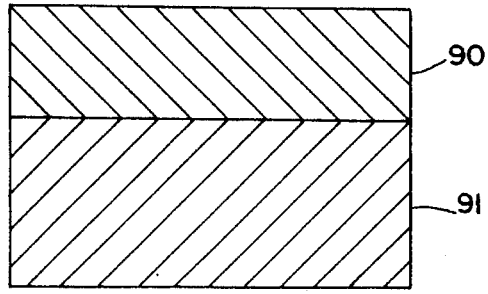
FIG. 8
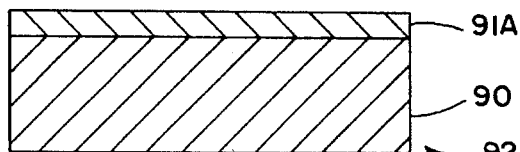
FIG. 9
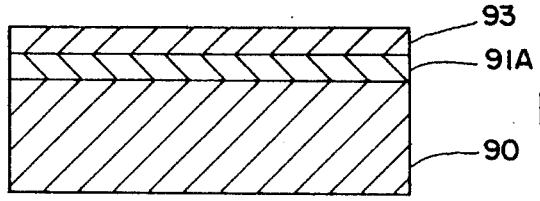
FIG. 10

DIAMOND FILM STRUCTURES AND METHODS RELATED TO SAME

BACKGROUND OF THE INVENTION

The present invention generally concerns diamond film structures, and more specifically concerns articles particularly configured for conducting, generating, absorbing and/or measuring the flow of thermal energy. Also disclosed are methods of forming same.

Diamond films have a very high thermal conductivity and stability, a large band gap, and excellent chemical/radiation resistance, thus making the diamond films useful in high temperature and/or chemically active and radiation active environments. Still further, pure diamond films are normally electrically insulative, but can be made electrically conductive by doping, thus making them useful in the electronic industry. With the advent of recent advances in chemical vapor deposition (CVD) processes, diamond films can now be grown on non-diamond substrates in high volume and in a cost effective manner. However, diamond film structures taking full advantage of these properties have not yet been developed.

For example, most currently available heater structures use a metal heater element embedded in an insulator. To monitor the temperature, thermocouples or temperature sensors are used. One kind uses platinum elements insulated by Kapton or by silicone rubber. However, the maximum attainable heater temperature is approximately 200° C. Further, the thickness of the heater is several thousandths of an inch. If temperature sensors are imbedded in the heaters, the thickness is increased and there are more layers joined by adhesives. The result of using these layers is increased thermal resistance and significant temperature drop inside the heater itself. Another kind of heater uses mica sheets to allow the reaching of about 600° C., maximum. However, this results in even thicker heaters, approximately 0.040 inches in thickness. Furthermore, the surfaces of the mica are not flat, since the outline of the heater elements is impressed on the surface. Also, the temperature drop in the mica is even greater than in the heaters mentioned above. Some silicon nitride coated heaters are used for temperatures in excess of 1000° C. However, integration of a sensor with the heater, poor thermal conductivity of electrical insulators, thermal mismatch between the heater element and the insulator coating, and poor thermal contact to the sample to be heated are some of the continuing major problems of present heater technology.

In another example, commercially available diamond heat sinks are typically attached to micro chips and integrated circuits by adhesive, such as thermal epoxies. However, as with heaters, the adhesive decreases the effectiveness of the adhered heat sinks. Thus, it is desirable to have Si/diamond or GaAs/diamond wafers, i.e., wafers with built-in diamond heats sinks.

Thus, diamond film structures solving the aforementioned problems are desired.

SUMMARY OF THE INVENTION

The present invention includes an article having a substrate including a surface, and first and second patterns of diamond film located on the substrate surface. One of the first and second patterns is an undoped electrically insulative diamond film configured to communicate thermal energy in a desired direction along the first pattern, and the other of the first and second patterns is a doped electrically conductive diamond film configured to communicate electrical energy in a desired direction along the second pattern. A part of the first pattern is in integral surface-to-surface contact with a part of the second pattern to facilitate heat transfer between the electrically conductive and electrically insulative diamond films.

These and other features, advantages and objects of the present invention will be further understood and appreciated by those skilled in the art by reference to the following specification, claims and appended drawings.

BRIEF DESCRIPTION OF THE DRAWINGS

FIG. 6A is a schematic view of another heat flux sensor utilizing diamond film structure embodying the present invention, the heat flux sensor being laminated onto a substrate surface;

FIG. 6B is a schematic view of another heat flux sensor utilizing diamond film structure embodying the present invention, the heat flux sensor being embedded in a substrate adjacent a surface of the substrate;

FIG. 7 is a schematic view of a heater utilizing diamond film structure embodying the present invention;

FIGS. 8–9 are schematic views illustrating formation of a diamond heat sink below a Si wafer embodying the present invention; and FIG. 10 is a schematic view illustrating an additional step film whereby GaAs is grown onto the silicon wafer/diamond structure shown in FIG. 9, tires producing a laminate structure of GaAs/Si on diamond film.

DETAILED DESCRIPTION OF PREFERRED EMBODIMENTS

Figure 1:
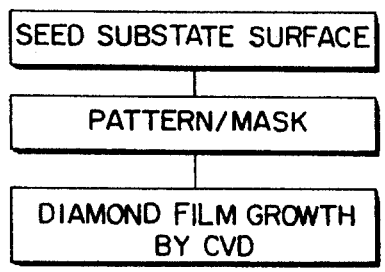
FIG. 1 is a flow diagram of a process for diamond film growth on a non-diamond substrate.

The process of growing a diamond film on a non-diamond substrate is well known in the art and well documented in publicly available literature. Briefly, one process (FIG. 1) includes "seeding" a non-diamond substrate surface with a uniform distribution of diamond particles, patterning or masking the seeded surface as desired, and then growing a diamond film from the diamond particles. A summary of several methods for "seeding" are disclosed in a copending U.S. patent application Ser. No. 08/178,783 entitled METHODS OF SEEDING FOR DIAMOND FILM GROWTH, filed Jan. 7, 1994 (filed simultaneously with this application), by inventor Mohammad Aslam, assigned to Michigan State University, the entire contents of which are incorporated herein.

DIAMOND FILMS CONFIGURED TO FORM THERMISTOR/HEATER

By doping a diamond film such as with boron, the diamond film, previously an electrically insulator, becomes a p type semiconductor. Further, doped diamond films exhibit a generally decreasing level of resistivity as temperature increases, thus allowing the doped diamond films to be used as thermistors or micro-thermal sensors. The method of fabrication disclosed below reveals a method of fabrication for a multilayer diamond structure that can act both as a temperature sensor and as a heater. The diamond sensor heater structure is not only inexpensive to manufacture, but also is resistant to harsh environments. The thermal mismatching, typical of conventional heater structures due to the use of different materials, is absent in the new structure due to the integral laminar arrangement of the diamond films which are in surface-to-surface contact substantially fully along their length.

Figure 2:
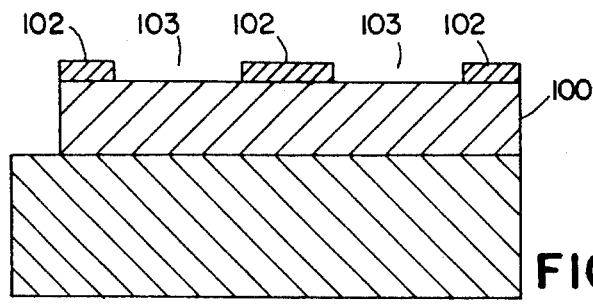
FIGS. 2–4 are schematic views illustrating formation of a multilayer diamond film structure embodying the present invention, the structure being useful as a temperature sensor and/or heater on a non-diamond substrate.
Figure 3:
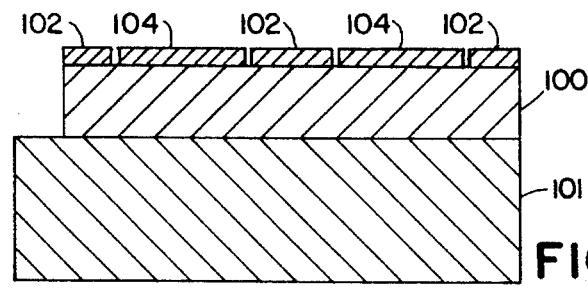
Figure 4:
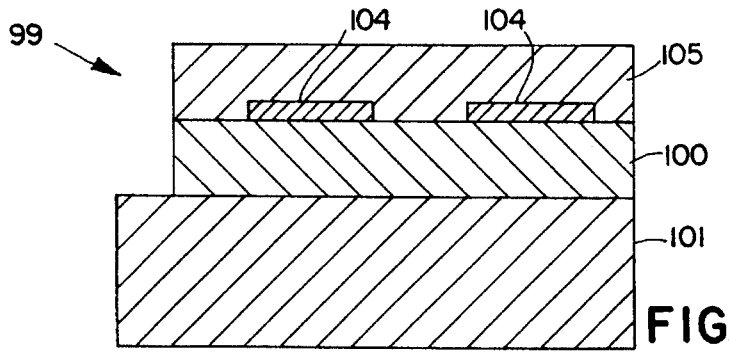

Initially referring to FIG. 2, a film of undoped diamond 100 is grown on a silicon substrate 101 such as by use of a CVD process. A mask 102 is then applied, such as a mask of $SiO_2$, the mask including apertures 103. For non-planar surfaces, a flexible two-dimensional mask can be used, or a three-dimensional mask can be used. Doped diamond film 104 is then grown in the apertures 103 by a CVD process (FIG. 3). Thereafter, the mask 102 is removed and undoped diamond film 105 is grown on the entire surface again by use of the CVD process (FIG. 4). Notably the pattern of doped diamond film 104 is fully encapsulated in cross section by the undoped diamond films 103 and 105 except at the ends of the doped diamond film which act as electrical leads for the sensor. Also, it is noted that the fabrication process described in FIGS. 2–4 can be utilized on planar and non-planar surfaces. Alternatively, the structure can be first deposited on a substrate and then, after removing the substrate, can be used as a stand alone thin film sensor/heater. Still further, the structure can be applied to a flexible substrate and later adhered to a non-planar surface or embedded in same.

Figure 5:
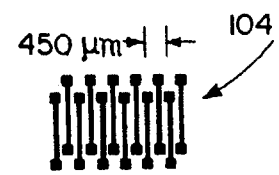
FIGS. 5–6 are schematic views of a heat flux sensor utilizing diamond film structure embodying the present invention.
Figure 6:
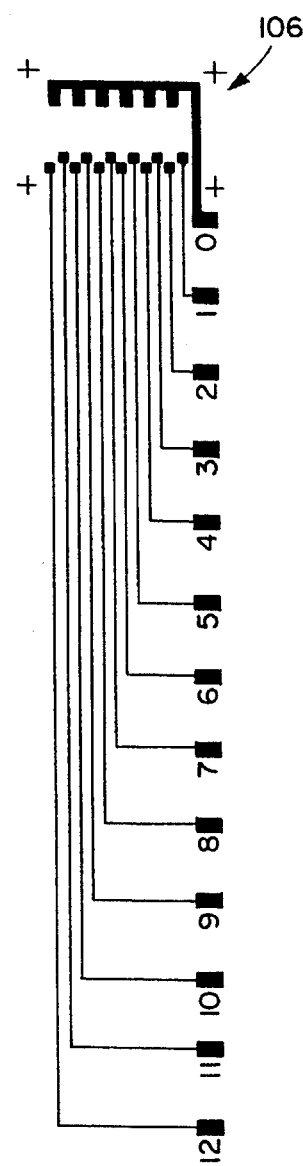

An exemplary doped diamond film pattern 104 is shown in plan view in FIG. 5, and a mating pattern of metal film leads 106 for same is shown in FIG. 6. A second exemplary doped diamond film pattern 108 is shown in FIG. 7, pattern 108 being serpentine in shape. The thickness of doped diamond film patterns 104 and 108 can be controlled to achieve a desired range of resistance/current carrying capability for the particular sensor being manufactured, while the diamond films 100 and 105 (which encapsulate patterns 104 or 108) provide maximum heat transfer and also protect the individual doped diamond films 104 and 108. In FIG. 7, a controller 108A, a voltage sensor 108B, and a constant current output 108C are operably connected to diamond pattern 108 to control electrical current communicated to and through pattern 108 and to sense changes in same.

Use of thin diamond films for heaters and temperature sensors has a number of advantages over conventional heaters. The temperature drop in a diamond heater is very much smaller than that for conventional heaters. Also, testing has shown that the response time of diamond sensors is very fast. Specifically, a thin diamond film temperature sensor speed was calculated to be about 290 ns (nanoseconds) for diamond films on quartz. Notably, the 290 ns speed was calculated by measuring the response time of a multi-layer diamond film temperature sensor on a silicon wafer, which was measured to have a response time of about 25 micro-seconds, and then by mathematically calculating the response time based upon thermal properties of quartz and diamond films. In particular, the diamond films have a high thermal conductivity, while the quartz has a low thermal conductivity. Thus the quartz does not tend to draw heat away from the diamond film when heat is applied, causing the diamond film sensor to be very responsive and accurate. It is noted that this compares to 2 ms for conventional temperature sensors.

In addition to speed, the temperature range of the diamond film structure is large, up to about 1500° C. for non-oxidizing environments and up to approximately 600° C. for oxidizing environments. Still further, the heater has the unusual characteristic of allowing much higher heat fluxes as the temperature increases, actually much larger than the devices mentioned above. Also, the electrical resistance of diamond can be tailored to vary over a large range. As a consequence, the temperature sensor/heater can be made in a thin sheet in one application if desired, rather than being serpentine. The result is greater uniformity of heating of a desired part. If it is necessary to wind the diamond back and forth in a serpentine pattern to achieve the desired resistance (such as is shown by heater 108 in FIG. 7), the diamond film structure has such a high thermal conductivity that it will tend to even out fluctuations much more than the Kapton and rubber coated heaters mentioned above. Further, diamond film layers 100 and 105 need not be in a serpentine pattern, but instead form a continuous sheet over a predetermined area, thus greatly promoting uniform heat transfer. It is noted that the exemplary serpentine-type heater shown in FIG. 7 can be used, for example, as a zirconium oxide gas sensor wherein the oxygen sensor must be heated in order to activate the sensor to sense oxygen.

Since diamond is such a durable material and it can withstand relatively extreme environments, it is possible to coat parts of surfaces of materials that are being used in thermally harsh environments, such as the NASA space vehicles, rocket nozzles, and various kinds of engines. Notably, a diamond film heater can be left permanently in the material or vehicle and can be used as a sensing device over the life of the vehicle. Alternatively, if the temperature is too high for the diamond, it can be embedded in material such as $SiO_2$ or $Si_3N_4$ and still be very useful for determining a number of physical quantities, such as thermal conditions during flight of a vehicle including surface heat flux and surface heat transfer coefficient histories. Embedded sensors can also be used to determine the thermal properties of the material. For example, decreases in the thermal conductivity over the life of the vehicle could indicate degradation in the material caused by these environments, including the development of cracks.

Another use of the diamond heater temperature sensor is to determine the presence of the build-up of ice on airplane or rocket surfaces. If there is an ice film, a short duration of heating of a surface CVD film would have a quite different response than if there was no ice present.

Diamond film can be deposited directly on many high temperature materials, thereby eliminating (or greatly reducing) the thermal resistance/poor thermal conductance caused by imperfect contact. This leads to improved monitoring and more accurate readings. Accurate readings are known to be particularly important in research, such as for example in petroleum and chemical fields. Notably, the range of heat flux measurement possible by diamond films is very wide, exceeding known prior art devices.

The technology for making patterned diamond films, for example the technology disclosed in U.S. patent application Ser. No. 08/178,783 entitled METHODS OF SEEDING FOR DIAMOND FILM GROWTH, previously incorporated by reference, permits the precise location of temperature sensors on substrate surfaces. For example, this technology allows the sensors to be positioned much more precisely and with much smaller separation distances than with thermocouples. The patterned diamond film thermal sensors can be positioned along a very thin line, thereby giving an average over a line. Also, measurements of the transient temperature over a very small region are possible, particularly as the temperature is increased.

The electrical resistance of diamond is very sensitive to temperature variation so that the same basic device can be used for both temperature measurement and as a heater. For example, the diamond film device can be used to heat a surface, and then measure and/or monitor the actual temperature of the surface. The local temperature can be made over a line or a series of lines, so that one or two dimensional measurements can be made at many positions on the surface. For example, testing has shown that the actual temperatures can be accurately measured between at least 80° K. (−193° C.) to 1270° K. (1000° C.).

In yet another example, diamond film laminated sensors comparable to that disclosed in FIGS. 5–6 are provided for measuring abnormalities in the flow of heat associated with a shock wave in a wind tunnel. The special temperature sensors have a very high spacial resolution (i.e. few microns) operating with ultra fast dynamic response time (i.e. few micro seconds). The sensors can be laminated to (FIG. 6A) or imbedded in (FIG. 6B) the surface of a highly thermal insulating body, and are small enough and of such shape as not to interfere with the aerodynamics. Further, the sensors are able to withstand the physically harsh environment in the wind tunnel. Due to these extremely harsh technological and operational demands, most conventional temperature sensors are rendered unsuitable. However, the remarkable combination of physical and electronic properties of chemical vapor deposition (CVD) diamond films, especially their high thermoconductivity, chemical inertness, radiation immunity, and wide energy band gap allow their possible application as high speed temperature sensors operating at elevated temperatures even in a wind tunnel environment.

A particular diamond film structure 110 is shown in FIG. 6A. The diamond film structure 110 is laminated onto a surface 112 of a solid 114, and is configured for use as a mass air flow sensor. A first diamond film 116 is located on surface 112 and is operably connected to an electrical energy source so that it can act as a heater. A second diamond film 118 is located a short distance downstream from film 116 on surface 112, and is operably connected to an electrical sensor so that it can be used to measure surface temperature. Notably, more than one downstream sensor can be used. The temperature rise at the downstream location (s) is related to the velocity of external fluid 120 and the heat generated by heater 116. It is noted that heater 116 can be operated in different ways such as by providing a constant power input, providing power to maintain a constant surface temperature or by providing intermittent (periodic) application of power. Thus, diamond film structure 110 can be used as a mass flow or velocity flow sensor.

Another diamond film structure 130 is shown in FIG. 6B. Diamond film structure 130 is embedded in a surface 132 of a solid 134, and is configured to be a self-calibratable heat flux sensor. It is noted that there are several commercially available heat flux transducers that include two or more temperature sensors separated by a thin layer of material having a relatively low (but known) thermal conductivity. However, the known commercially available heat flux sensors must be calibrated by subjecting them to a known heat flux generated by an external heat source. Diamond film structure 130 advantageously incorporates CVD diamond films 136 and 138 about a layer of material 140 having a known thermal conductivity. Calibration is achieved by using one film (such as outer film 136) as a heater, and then correlating the resultant change in thermal resistivity (i.e. the temperature change) of the other film (such as inner film 138) over time based on the heat generated by heater 136 and based on the thermal conductivity of layer 140.

DIAMOND FILM CONFIGURED TO FORM HEAT SINK

In FIGS. 8–10, a stress-free semiconductor on a diamond substrate is shown which is configured to solve the heat dissipation problems encountered in submicron ultra large scale integrated (VLSI) circuits. This structure is contemplated to be especially useful in the case of GaAs microchips since GaAs microchips have heat buildup problems caused by the low thermal conductivity of GaAs. A stress-free layer of diamond film 90 is initially grown on a silicon substrate wafer 91 (FIG. 8), followed by thinning and polishing processes on the wafer 91. This forms a diamond and silicon laminate 92 having a thin silicon film 91A of at least about 2 to 5 microns and potentially even up to 10 microns or more although this affects heat transfer through the silicon film 91A (FIG. 9). The thinning and polishing processes for Si are standard processes generally known in the industry. For GaAs on diamond wafers, a layer of GaAs 93 is then grown on the polished Si layer of the laminate 92 (FIG. 10), the GaAs thickness being at least about 2 to 5 microns. The growth of GaAs on Si has already been commercialized and is known in the art such that it need not be described herein. It is noted that the typical thicknesses of Si in Si/diamond wafers is in the range of 4–10 microns or more (FIG. 9), and typical thickness of GaAs in GaAs/diamond wafers is in the range of 4–15 microns or more (FIG. 10).

This new technology integrates the diamond heat sinks with a thin semiconductor wafer. The integration of diamond and wafer fabrication technologies is expected to reduce the cost of wafers and the heat sinks, help increase the density of GaAs and Si microchips and increase the chip speed. This new technology can be used in areas of ultra large scale integrated circuits (IC), GaAs microchips, microchips based on other compound semiconductors, opticelectronic devices, and power devices. In such cases where the IC fabrication involves the use of oxidizing environment above 650 degrees C., the diamond substrate supporting the Si or GaAs active layers needs to be protected or encapsulated by $SiO_2$ or $Si_3N_4$ to avoid oxidation of diamond from the diamond wafer. It is noted that a diamond film heater can be incorporated into the diamond film layer 90 if desired, such as to reach operating temperatures more quickly and uniformly.

Thus, novel structures are provided including laminated layers of the diamond film in different patterns for conducting, generating, absorbing and/or measuring the flow of thermal energy. Some of the layers are doped and thus electrically conductive, and others of the layers are undoped and thus electrically insulative. The novel structures provide thermal sensors, heaters, heat sinks, and the like having desirable properties such as high thermal conductivity, high chemical resistance, and high hardness/wear resistance due to the properties of the diamond films.

In the foregoing description it will be readily appreciated by those skilled in the art that modifications may be made to the invention without departing from the concepts disclosed herein. Such modifications are to be considered as included in the following claims, unless these claims by their language expressly state otherwise.

The embodiments of the invention in which an exclusive property or privilege is claimed are defined as follows:

1. A method of heating and sensing temperature comprising steps of:

providing a substrate including a surface and a temperature-sensitive structure attached to said surface, said temperature-sensitive structure including an electrically conductive diamond film having an electrical resistivity that characteristically changes in response to temperature change;

applying an electrical source having a voltage to said temperature-sensitive structure in order to induce a current through said conductive diamond film to thereby heat said temperature-sensitive structure and the substrate surface to an elevated operating temperature; and determining one of an actual temperature and a relative temperature change based on said characteristic electrical resistivity of said conductive diamond film by sensing a change in one or both of said voltage and said current.

2. A method as defined in claim 1 wherein said temperature-sensitive structure includes a second diamond film that is electrically non-conductive for communicating thermal energy across said substrate to provide a substantially uniform temperature over the area of said temperature-sensitive structure.

3. A method as defined in claim 1 including a step of embedding said diamond film in said surface of said substrate.

4. A method as defined in claim 1 including it step of forming said diamond film on said surface of said substrate.

5. A method as defined in claim 1 including steps of providing a controller operably connected to said electrical source for controlling the current induced in the step of applying an electrical source when heating said structure and surface to the elevated operating temperature.

6. A method of heating and sensing temperature comprising steps of:

heating a substrate to an elevated operating temperature by applying an electrical source having a voltage to an electrically conductive doped diamond film positioned on a surface of the substrate; and determining the temperature of the substrate at the surface by measuring a voltage differential across the conductive doped diamond film.

7. A method as defined in claim 6 wherein the steps of heating the substrate and determining the temperature are conducted sequentially.

8. A method as defined in claim 7 including repeating the steps of heating the substrate and determining the temperature, until a stable operating temperature is achieved on the surface.

9. A method as defined in claim 8 including a step of applying the conductive doped diamond film to a selected area of the substrate surface in a predetermined pattern.

10. A method as defined in claim 6 wherein the operating temperature approaches 600° C. or greater.

11. A method of heating and sensing temperature comprising steps of:

applying an electrically conductive doped diamond film to an area of a substrate surface that requires heating to a predetermined minimum elevated operating temperature before use, the conductive doped diamond film defining a predetermined pattern and area configured to uniformly heat the area;

heating the selected area of the substrate surface to a substantially elevated and stable operating temperature by applying an electrical source having a voltage to the electrically conductive doped diamond film;

thereafter determining the temperature of the substrate at the surface by measuring a voltage differential across the conductive doped diamond film; and repeating the steps of heating and determining temperature at least once and until the elevated operating temperature is reached and has stabilized.

\* \* \* \* \*